(12) United States Patent
Takeuchi et al.

(10) Patent No.: US 11,719,741 B2
(45) Date of Patent: Aug. 8, 2023

(54) BURN-IN BOARD AND BURN-IN APPARATUS

(71) Applicant: ADVANTEST Corporation, Tokyo (JP)

(72) Inventors: Hiroaki Takeuchi, Tokyo (JP); Koji Hirashima, Tokyo (JP); Kenji Nishi, Tokyo (JP); Chen-Pi Chang, Tokyo (JP); Wen Yung Wu, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/703,992

(22) Filed: Mar. 25, 2022

(65) Prior Publication Data
US 2022/0334173 A1    Oct. 20, 2022

(30) Foreign Application Priority Data
Apr. 19, 2021   (JP) .................................. 2021-070504

(51) Int. Cl.
*G01R 31/10* (2006.01)
*G01R 31/28* (2006.01)

(52) U.S. Cl.
CPC ..... *G01R 31/2863* (2013.01); *G01R 31/2862* (2013.01)

(58) Field of Classification Search
CPC ............ G01R 31/2862; G01R 31/2863; G01R 31/2874; G01R 31/2886; G01R 31/2889; G01R 1/0408; G01R 1/0466
See application file for complete search history.

(56) References Cited

U.S. PATENT DOCUMENTS

| | | | | |
|---|---|---|---|---|
| 6,815,966 B1* | 11/2004 | Gunn | .................... | G06F 11/24 714/E11.154 |
| 6,982,566 B1* | 1/2006 | Alam | .................. | G01R 31/2863 324/750.05 |
| 7,345,495 B2* | 3/2008 | Dangelo | ............ | G01R 31/2863 324/750.06 |
| 2001/0050569 A1* | 12/2001 | Hashimoto | .......... | G01R 1/0433 324/756.02 |
| 2009/0267628 A1* | 10/2009 | Takase | ............. | G01R 31/31905 324/763.01 |

(Continued)

FOREIGN PATENT DOCUMENTS

JP    H09-229995 A   9/1997
JP    2014-025829 A  2/2014

(Continued)

OTHER PUBLICATIONS

Office Action issued in corresponding Taiwanese Patent Application No. 111110309 dated Jan. 9, 2023 (7 pages).

*Primary Examiner* — Thang X Le
(74) *Attorney, Agent, or Firm* — Osha Bergman Watanabe & Burton LLP

(57) ABSTRACT

A burn-in board includes: a board; sockets mounted on the board; a connector mounted on the board; and wiring systems disposed in the board and connecting the sockets and the connector. The wiring systems comprise: a first wiring system that transmits a first signal; and a second wiring system that transmits a second signal different from the first signal, and a type of a first connection form of the first wiring system is different from a type of a second connection form of the second wiring system.

12 Claims, 4 Drawing Sheets

(56) References Cited

U.S. PATENT DOCUMENTS

2009/0287362 A1\* 11/2009 Maesaki ............ G01R 31/2875
365/201
2015/0084051 A1\* 3/2015 Kubo ..................... H05K 1/181
438/15
2020/0379033 A1 12/2020 Chang

FOREIGN PATENT DOCUMENTS

| KR | 10-2016-0007138 A | 1/2016 |
| TW | 201142320 A | 12/2011 |
| TW | 201917397 A | 5/2019 |

\* cited by examiner

BURN-IN BOARD AND BURN-IN APPARATUS

CROSS-REFERENCE TO RELATED APPLICATIONS

The present application claims priority from Japanese Patent Application No. 2021-070504 filed on Apr. 19, 2021, the contents of which are incorporated herein by reference in their entirety.

BACKGROUND

Technical Field

The present disclosure relates to a burn-in board for using in a burn-in test of an electronic component under test (DUT: Device Under Test) such as a semiconductor integrated circuit device, and a burn-in apparatus including the burn-in board.

Description of Related Art

A burn-in apparatus is known that includes a burn-in board having sockets to which DUTs can be respectively mounted, a burn-in chamber that accommodates the burn-in board and applies thermal stress to the DUTs, and a burn-in controller that inputs and outputs signals to and from the DUTs via the burn-in board (refer to, for example, Patent Document 1). In this burn-in apparatus, the burn-in board and the burn-in controller are electrically connected each other by fitting the connector of the burn-in board with the connector of the burn-in chamber.

PATENT DOCUMENT

Patent Document 1: JP 2014-025829 A

The socket described above is connected to the driver of the burn-in controller via a connector, and signals are input and output from the driver to the DUT. Since the number of this driver is limited, it is necessary to connect multiple sockets to the same driver via the wiring system.

On the other hand, as the number of sockets mounted on the burn-in board is increased, the difference in the wiring length between the connector and the socket tends to increase among the plurality of sockets. Depending on the type of signal input and output from the burn-in controller to the DUT, the difference in the wiring length between these sockets may affect the quality of the burn-in test.

Therefore, when the number of sockets on the burn-in board is increased and all the wiring system have the same type of connection form, the quality of the burn-in test may be deteriorated depending on the type of signal.

SUMMARY

The present disclosure provides a burn-in board and a burn-in apparatus capable of suppressing the deterioration of the quality of the burn-in test even when the number of sockets is increased.

[1] A burn-in board according to one or more embodiments is a burn-in board comprising: a board; sockets that are mounted on the board; a connector that is mounted on the board; and wiring systems that are disposed in the board and connect the sockets and the connector, in which the wiring systems includes: a first wiring system that transmits a first signal; and a second wiring system that transmits a second signal different from the first signal, and a type of a first connection form of the first wiring system and a type of a second connection form of the second wiring system are different from each other.

[2] In one or more embodiments, the first connection form may be a connection form that has a portion in which a wiring branches between the connector and the socket and is connected to another of the sockets, and the second connection form may be a connection form that does not have a portion in which a wiring branches between the connector and the socket.

[3] In one or more embodiments, the sockets may include first to fourth sockets, and the first wiring system may comprise: a first main line that is connected to the connector; first and second sub lines that are connected to the first main line at a branch point and are respectively connected to the first and third sockets; a first connection line that connects the first socket and the second socket; and a second connection line that connects the third socket and the fourth socket.

[4] In one or more embodiments, the board may have: a first end on (to) which the connector is mounted (attached); and a second end that is opposite to the first end, the first and second sockets may be aligned along a first direction from the first end toward the second end, the third and fourth sockets may be aligned along the first direction, the first and third sockets may be aligned along a second direction substantially orthogonal to the first direction, and the second and fourth sockets may be aligned along the second direction.

[5] In one or more embodiments, a wiring length between the branch point and the first socket may be substantially the same as a wiring length between the branch point and the third socket, and a wiring length between the branch point and the second socket may be substantially the same as a wiring length between the branch point and the fourth socket.

[6] In one or more embodiments, the sockets may include fifth to seventh sockets, and the second wiring system may comprise: a second main line that is connected to the connector and is connected to the fifth socket; a third connection line that connects the fifth socket and the sixth socket; and a fourth connection line that connects the sixth socket and the seventh socket.

[7] In one or more embodiments, the board may have: a first end on (to) which the connector is mounted (attached); and a second end that is opposite to the first end, and the fifth to seventh sockets may be aligned in order along a first direction from the first end toward the second end.

[8] In one or more embodiments, the first socket and the fifth socket may be the same socket, and the second socket and the sixth socket may be the same socket.

[9] In one or more embodiments, the first signal may include an output signal from a DUT that is electrically connected to the socket, and the second signal may include an input signal to the DUT.

[10] A burn-in apparatus according to one or more embodiments is a burn-in apparatus comprising the burn-in board described above.

According to one or more embodiments, the wiring systems of the burn-in board includes the first wiring system that transmits the first signal; and the second wiring system that transmits the second signal different from the first signal, and the type of the first connection form of the first wiring system and the type of the second connection form of the second wiring system are different from each other. That is, according to one or more embodiments, the type of the connection form of the wiring system is different depending on the type of the signal. Thus, according to one or more embodiments, even when the number of sockets on the burn-in board is increased, it is possible to suppress the deterioration of the test quality of the burn-in test.

DETAILED DESCRIPTION

Hereinafter, embodiments will be described with reference to the drawings.

Figure 1:
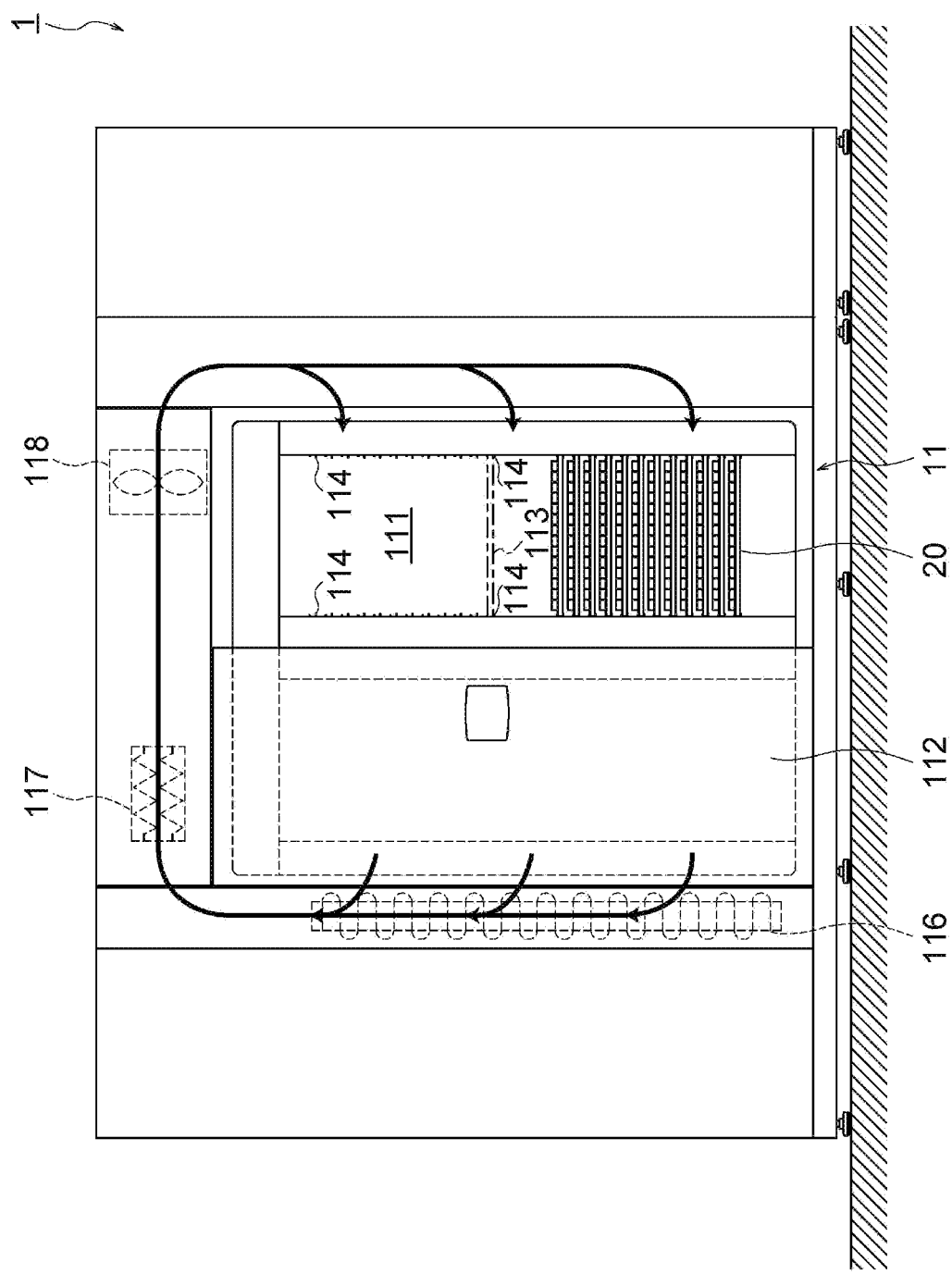
FIG. 1 is a front view illustrating a burn-in apparatus in one or more embodiments.
Figure 2:
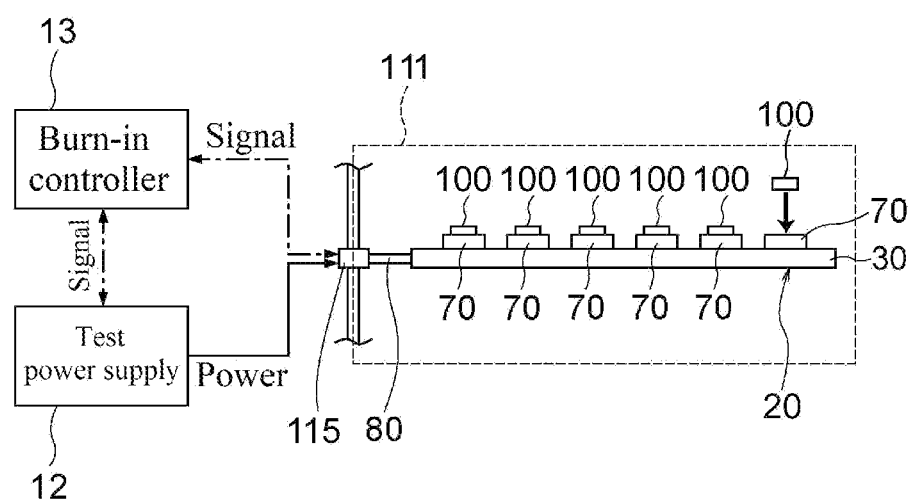
FIG. 2 is a block diagram illustrating a system configuration of the burn-in apparatus in one or more embodiments.

First, an overall configuration of a burn-in apparatus 1 of one or more embodiments will be described with reference to FIGS. 1 and 2. FIG. 1 is a front view of the burn-in apparatus in one or more embodiments, and FIG. 2 is a block diagram illustrating a system configuration of the burn-in apparatus of one or more embodiments.

The burn-in apparatus 1 of one or more embodiments is an apparatus that performs a burn-in test that is a kind of screening test for extracting an initial defect of a DUT such as an IC chip and removing an initial defective product. As illustrated in FIGS. 1 and 2, the burn-in apparatus 1 includes a burn-in chamber 11 that accommodates a burn-in board 20, a test power supply 12 that applies a power voltage to a DUT 100 (see FIG. 2) mounted on the burn-in board 20, and a burn-in controller 13 that inputs and outputs signals to the DUT 100.

The burn-in apparatus 1 performs screening on the DUT 100 by applying the power supply voltage and inputting and outputting the signals to and from the DUT 100 while applying thermal stress (for example, about −25° C. to +125° C.) to the DUT 100 mounted on the burn-in board 20 accommodated in the burn-in chamber 11. The DUT 100 in one or more embodiments is a memory device. The DUT 100 to be tested is not particularly limited, but may be, for example, a logic device and a SoC (System on a chip).

As illustrated in FIG. 1, the burn-in chamber 11 includes a thermostatic room 111 that is defined by a heat insulation wall or the like, and a door 112 capable of opening and closing the thermostatic room 111. A plurality of slots 113 for holding the burn-in boards 20 are disposed in the thermostatic room 111. Each of the slots 113 includes a pair of rails 114 supporting both right and left ends of the burn-in board 20. The burn-in board 20 is carried into the thermostatic room 111 through the door 112 while sliding on the rails 114. In the thermostatic room 111, the two rows of twenty four stages of slots 113 are disposed to accommodate the forty eight burn-in boards 20 in total.

In the Figure, one door (the door on the right side in the figure) is not shown, but is shown in a state where the thermostatic room 111 is open. On the other hand, the other door 112 (the door on the left side in the figure) is shown in a closed state, and the twenty four stages of slots 113 on the left side in the figure is not shown. The number and arrangement of the slots 113 (that is, the number and positional relationship of the burn-in boards 20 accommodated in the thermostatic room 111) is not limited to the example illustrated in FIG. 1 and can be arbitrarily set in consideration of the test efficiency and the like.

A connector 115 (see FIG. 2) is disposed inside each of the slots 113. A connector 80 of the burn-in board 20 inserted into the slot 113 can be fitted to the connector 115.

As illustrated in FIG. 2, the connector 115 is electrically connected to the DUT power supply 12 and the burn-in controller 13. Only one burn-in board 20 is illustrated in FIG. 2, but the other burn-in boards 20 are also connected to the DUT power supply 12 and the burn-in controller 13 in the same manner.

Further, as illustrated in FIG. 1, the burn-in chamber 11 includes an evaporator 116, a heater 117, and a fan 118. The air inside the thermostatic room 111 is cooled by the evaporator 116 or heated by the heater 117 while being circulated by the fan 118. Accordingly, temperature inside the thermostatic room 111 is adjusted. The operations of the evaporator 116, the heater 117, and the fan 118 are controlled by the burn-in controller 13.

The DUT power supply 12 is connected to each DUT 100 on the burn-in board 20 via the connectors 115 and 80 so as to apply a power supply voltage to each DUT 100 and is controlled by the burn-in controller 13.

In addition to the control of the voltage applied to the DUT 100, the input and output of the signals to and from the DUT 100, and the control of the temperature adjustment in the thermostatic room 111, the burn-in controller 13 determines the DUT 100 having an abnormal response during a burn-in test as a defective product, stores a serial number (for example, corresponding to the number of the slot 113 and the position on the burn-in board 20) of the DUT 100, and feeds back the test result.

Figure 3:
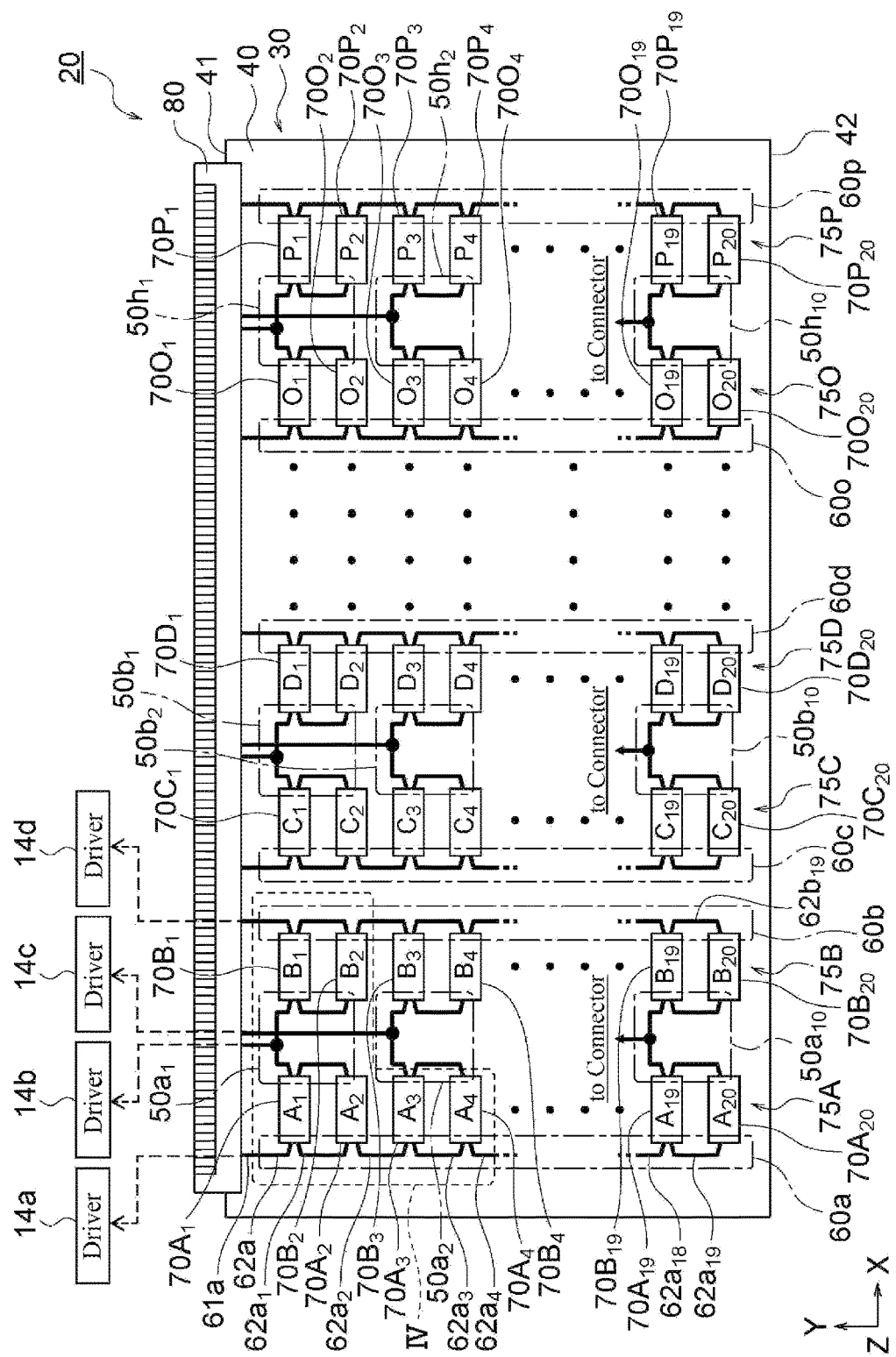
FIG. 3 is a schematic plan view showing the wiring systems of the burn-in board in one or more embodiments.
Figure 4:
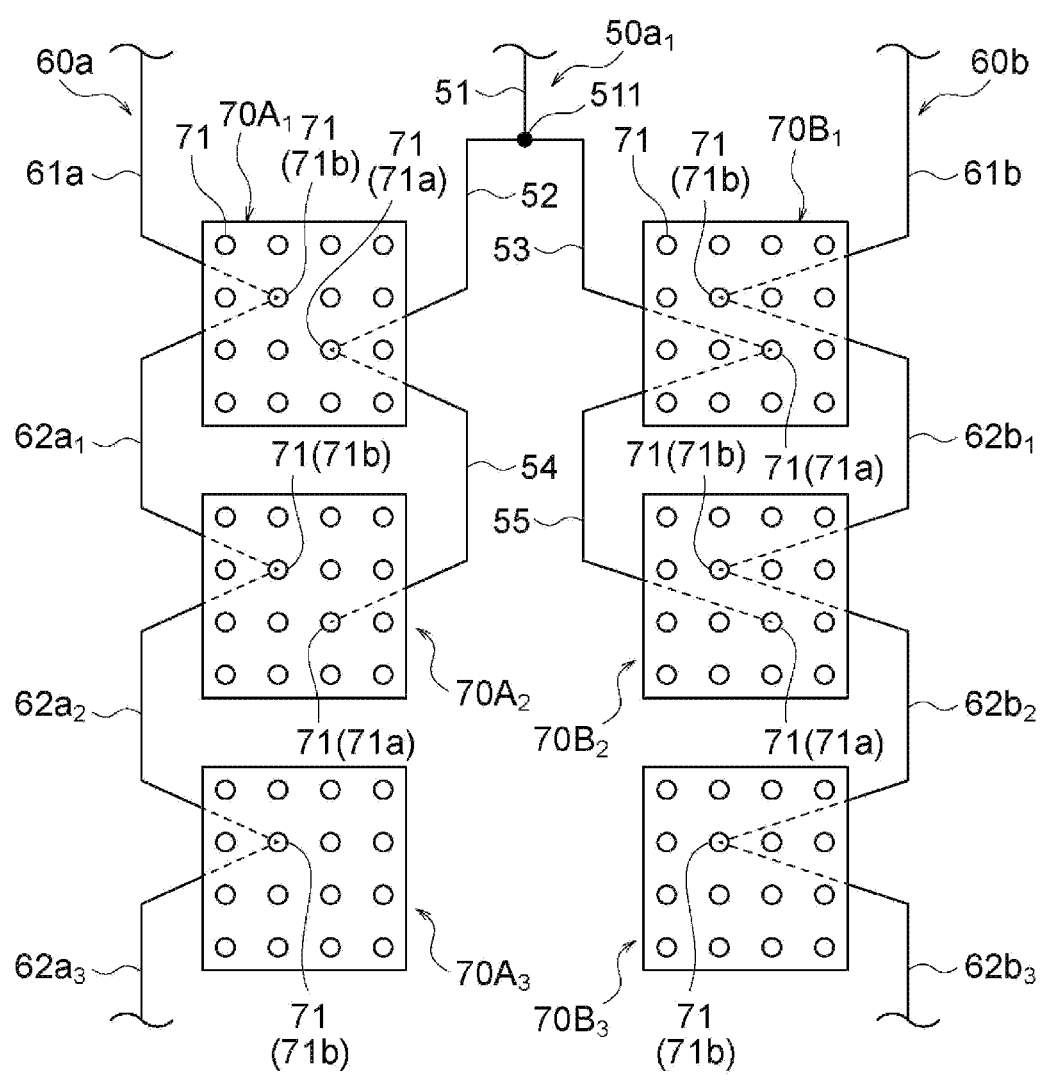
FIG. 4 is an enlarged view of part IV of FIG. 3.

Next, the configuration of the burn-in board 20 in one or more embodiments will be described with reference to FIGS. 3 and 4. FIG. 3 is a schematic plan view showing the wiring systems of the burn-in board in one or more embodiments, and FIG. 4 is an enlarged view of part IV of FIG. 3.

As shown in FIG. 3, the burn-in-board 20 in one or more embodiments includes a wiring board 30, a plurality of (320 in one or more embodiments) sockets $70A_1$ to $70P_{20}$ that are mounted on the wiring board 30, and a connector 80 that is mounted on the wiring board 30.

The DUT 100 can be mounted on each of the sockets $70A_1$ to $70P_{20}$. Hereinafter, the sockets $70A_1$ to $70P_{20}$ will be also collectively referred to as a socket 70. Further, the connector 80 is mounted on one end (upper edge in FIG. 3) 41 in the board 40 of the wiring board 30 and can fit the connector 115 disposed in the chamber-in chamber 11 as described above. The burn-in board 20 may include a reinforcing frame for reinforcing the wiring board 30, and a bottom cover for protecting the rear surface of the wiring board.

The socket $70A_1$ corresponds to an example of the "first socket" in one or more embodiments, the socket $70A_2$ corresponds to an example of the "second socket" in one or more embodiments, the socket $70B_1$ corresponds to an example of the "third socket" in one or more embodiments, the socket $70B_2$ corresponds to an example of the "fourth socket" in one or more embodiments. Further, the socket $70A_1$ corresponds to an example of the "fifth socket" in one or more embodiments, the socket $70A_2$ corresponds to an example of the "sixth socket" in one or more embodiments, the socket $70A_3$ corresponds to an example of the "seventh socket" in one or more embodiments.

As shown in FIG. 4, each of the sockets 70 has a plurality of (16 in one or more embodiments) contact pins 71 that come into contact with the terminals of the DUT 100. The plurality of contact pins 71 are arranged in a matrix so as to correspond to the terminals of the DUT 100. When the DUT 100 is mounted on the socket 70 for the burn-in test, the contact pin 71 comes into contact with the terminal of the DUT 100 so that the DUT 100 and the socket 70 are electrically connected. The sockets $70A_1$ to $70P_{20}$ have the same structure.

The number of the contact pins 71 included in the socket 70 is not particularly limited to the above. The arrangement of the contact pins 71 included in the socket 70 is not particularly limited to the above.

As shown in FIG. 3, the plurality of sockets $70A_1$ to $70P_{20}$ are arranged in a matrix on the board 40 of the wiring board 30.

More specifically, in one or more embodiments, twenty sockets $70A_1$ to $70A_{20}$ are arranged in a row along the first direction on the board 40, and one socket row 75A is formed by these sockets $70A_1$ to $70A_{20}$. The first direction is a direction from the first end 41 toward the second end 42 on the opposite side of the first end 41 in the board 40 and corresponds to −Y direction in the figure. The twenty sockets $70A_1$ to $70A_{20}$ constituting the socket row 75A are arranged substantially at equal intervals.

Similarly, twenty sockets $70B_1$ to $70B_{20}$ arranged along the first direction are arranged in a row, and one socket row 75B is formed by these sockets $70B_1$ to $70B_{20}$. The twenty sockets $70B_1$ to $70B_{20}$ constituting the socket row 75B are also arranged at substantially equal intervals. In the same manner, the other fourteen socket rows 75C to 75P are respectively constituted by twenty sockets 70 arranged at equal intervals along the first direction.

The sixteen socket rows 75A to 75P are arranged along the second direction. The second direction is a direction substantially orthogonal to the above-described first direction (the −Y direction in the figure) and corresponds to the X direction in the figure. The rows of sockets 75A to 75P are arranged at substantially equal intervals.

The number of sockets 70 mounted on the board 40 is not particularly limited to the above. The arrangement of the sockets 70 on the board 40 is not particularly limited to the above.

The wiring board 30 in one or more embodiments is a printed wiring board on which a plurality of sockets $70A_1$ to $70P_{20}$ described above are mounted. As shown in FIG. 3, the wiring board 30 includes a board (substrate) 40 that has an electrical insulating property, and two types of wiring systems $50a_1$ to $50h_{10}$ and $60a$ to $60p$. In one or more embodiments, the wiring board 30 is a multilayer wiring board, and each of the wiring systems $50a_1$ to $50h_{10}$ and $60a$ to $60p$ is constituted by a conductive path such as a wiring pattern and a via hole formed in the board 40.

In one or more embodiments, the type of the connection form of the first wiring systems $50a_1$ to $50h_{10}$ are different from the type of the connection form of the second wiring systems $60a$ to $60p$. Here, the connection form (the connection configuration/the connection topology) is a form of electrical connection between the connector 80 and a plurality of sockets 70 in the wiring board 30 and is represented by the connection path (the positional relationship of the wiring and branch point) configured by combining the wiring and the branch point for connecting the connector 80 and a plurality of sockets 70. It is possible to classify the type of the connection form according to the presence or absence of a branch point and the position of the branch point. In one or more embodiments, the first wiring systems $50a_1$ to $50h_{10}$ have a connection form that has a branch point, whereas the second wiring systems $60a$ to $60p$ have a connection form that has no branch point. The number of types of connection forms of the wiring systems included in the wiring board 30 has is not particularly limited, the wiring board may include wiring systems having three or more types of connection forms.

Since the first wiring systems $50a_1$ to $50h_{10}$ have basically the same configuration, the configuration of the first wiring system $50a_1$ will be representatively described below, and description of the configuration of the other first wiring systems $50a_2$ to $50h_{10}$ will be omitted. Similarly, since the second wiring systems $60a$ to $60p$ have basically the same configuration, the configuration of the second wiring system $60a$ will be representatively described below, and the description of the configuration of the other second wiring systems $60b$ to $60p$ will be omitted.

The first wiring system $50a_1$ has a connection form that has a portion in which wiring branches between the connector 80 and the socket $70A_1$ and is connected to the socket $70B_1$. Specifically, as shown in FIG. 4, the first wiring system $50a_1$ includes a main line 51, sub lines 52 and 53, and connection lines 54 and 55. The main line 51, the sub lines 52 and 53, and the connecting lines 54 and 55 are constituted by a conductive path such as a wiring pattern and a via hole formed in the board 40.

The main line 51 corresponds to an example of the "first main line" in one or more embodiments, the sub line 52 corresponds to an example of the "first sub line" in one or more embodiments, the sub line 53 corresponds to an example of the "second sub line" in one or more embodiments, the connection line 54 corresponds to an example of the "first connection line" in one or more embodiments, the connection line 55 corresponds to an example of the "second connection line" in one or more embodiments.

The main line 51 is connected to the connector 80 at one end the main line 51. A branch point 511 is disposed at the other end of the main line 51, and the main line 51 branches into two sub lines 52 and 53 at the branch point 511. The one sub line 52 is connected to a connection line 54 and a socket $70A_1$ at the distal end of the sub line 52. The connection line 54 is connected to the next socket $70A_2$ at the distal end of the connection line 54. Similarly, the other sub line 53 is also connected to the connection line 55 and the socket $70B_1$ at the distal end of the sub line 53. The connection line 55 is connected to the next sockets $70B_2$ at the distal end of the connection line 55.

That is, in the first wiring system $50a_1$, the wiring is branched into two between the connector 80 and the socket $70A_1$ and $70B_1$. In the first wiring system $50a_1$, the socket $70A_1$ connected to the one sub line 52 and the socket $70A_2$ aligned with the socket $70A_1$ along the first direction are connected in a daisy chain shape by a connection line 54. Similarly, in the first wiring system $50a_1$, the socket $70B_1$ connected to the other sub line 53 and the socket $70B_2$ aligned with the socket $70B_1$ along the first direction are connected in a daisy chain shape by a connection line 55.

In one or more embodiments, the length of the sub line 52 between the branch point 511 and the socket $70A_1$ and the length of the sub line 53 between the branch point 511 and the socket $70B_1$ are substantially the same. Therefore, the transmission time of the signal of the socket $70A_1$ and the transmission time of the signal of the socket $70B_1$ are substantially the same.

Further, the length of the connection line 54 between the socket $70A_1$ and the socket $70A_2$ and the length of the connection line 55 between the socket $70B_1$ and the socket $70B_2$ are substantially the same. Therefore, the total length of the sub line 52 and the connection line 54 between the branch point 511 and the socket $70A_2$ and the total length of the sub line 53 and the connection line 55 between the branch point 511 and the socket $70B_2$ are substantially the same. Therefore, the transmission time of the signal of the socket $70A_2$ and the transmission time of the signal of the socket $70B_2$ are substantially the same.

The first wiring system $50a_2$ also has the same wiring system as the first wiring system $50a_1$ described above. As shown in FIG. 3, the first wiring system $50a_2$ connects the connector 80 and the four sockets $70A_3$, $70A_4$, $70B_3$ and $70B_4$.

Although not particularly shown, the first wiring systems $50a_3$ to $50a_9$ also have the same wiring system as the first wiring system $50a_1$ described above. The first wiring system $50a_3$ connects the connector 80 and the four sockets $70A_5$, $70A_6$, $70B_5$ and $70B_6$. The first wiring system $50a_4$ connects the connector 80 and the four sockets $70A_7$, $70A_8$, $70B_7$ and $70B_8$. The first wiring system $50a_5$ connects the connector 80 and the four sockets $70A_9$, $70A_{10}$, $70B_9$ and $70B_{10}$. The first wiring system $50a_6$ connects the connector 80 and the four sockets $70A_{11}$, $70A_{12}$, $70B_{11}$ and $70B_{12}$. The first wiring system $50a_7$ connects the connector 80 and the four sockets $70A_{13}$, $70A_{14}$, $70B_{13}$ and $70B_{14}$. The first wiring system $50a_8$ connects the connector 80 and the four sockets $70A_{15}$, $70A_{16}$, $70B_{15}$ and $70B_{16}$. The first wiring system $50a_9$ connects the connector 80 and the four sockets $70A_{17}$, $70A_{18}$, $70B_{17}$ and $70B_{18}$.

The first wiring systems $50a_{10}$ also have the same wiring system as the first wiring system $50a_1$ described above. As shown in FIG. 3, the first wiring systems $50a_{10}$ connects the connector 80 and the four sockets $70A_{19}$, $70A_{20}$, $70B_{19}$ and $70B_{20}$.

That is, ten first connection forms $50a_1$ to $50a_{10}$ each of which connects four sockets 70 and the connector 80 are provided for two socket rows 75A and 75B. Similarly, in the other socket rows 75C to 75P, ten first connection forms $50b_1$ to $50h_{10}$ are provided for every two socket rows. As a result, the burn-in board 20 of one or more embodiments includes eighty first connection forms $50a_1$ to $50h_{10}$ for 320 sockets $70A_1$ to $70P_{20}$.

On the other hand, the second wiring system 60a has a connection form that does not have a portion in which a wiring branches between the connector 80 and the sockets $70A_1$ to $70A_{20}$. Specifically, as shown in FIGS. 3 and 4, the second wiring system 60a includes a main line 61a and connection lines $62a_1$ to $62a_{19}$. The main line 61a and the connection lines $62a_1$ to $62a_{19}$ are constituted by a conductive path such as a wiring pattern and a via hole formed in the board 40.

The main line 61a corresponds to an example of the "second main line" in one or more embodiments, the connection lines $62a_1$ corresponds to an example of the "third connection line" in one or more embodiments, the connection lines $62a_2$ corresponds to an example of the "fourth connection line" in one or more embodiments.

The main line 61a is connected to the connector 80 at one end of the main line 61a. The other end of the main line 61a is connected to the connection line $62a_1$ and also to the socket $70A_1$. The connection line $62a_1$ is connected to the next connection line $62a_2$ and is also connected to the next socket $70A_2$ at the distal end of the connection line $62a_1$. Similarly, the connecting lines $62a_2$ to $62a_{18}$ are connected to the next connecting lines $62a_3$ to $62a_{19}$ and are also connected to the next sockets $70A_3$ to $70A_{19}$ at the ends the connecting lines $62a_2$ to $62a_{18}$. The last connection line $62a_{19}$ is connected to the socket $70A_{20}$ at the distal end of the connection line $62a_{19}$.

That is, in the second wiring system 60a, the wiring does not branch at all between the connector 80 and the sockets $70A_1$ to $70A_{20}$. In the second wiring system 60a, twenty sockets $70A_1$ to $70A_{20}$ constituting the socket row 75A by being aligned in a row along the first direction are connected in a daisy chain shape by the connection lines $62a_1$ to $62a_{19}$.

The second wiring system 60b also have the same wiring system as the second wiring system 60a described above, and twenty sockets $70B_1$ to $70B_{20}$ constituting the socket row 75B are connected in a daisy chain shape. That is, as shown in FIGS. 3 and 4, the second wiring system 60b includes a main line 61b and connection lines $62b_1$ to $62b_{19}$. The main wire 61b is connected to the connector 80 at one end of the main wire 61b. The other end of the main wire 61b is connected to the connection wire $62b_1$ and also to the socket $70B_1$. The twenty sockets $70B_1$ to $70B_{20}$ are connected in a daisy chain shape by the connection lines $62b_1$ to $62b_{19}$.

Similarly, the second wiring systems 60c to 60p also have the same wiring system as the second wiring system 60a described above, and twenty sockets 70 respectively constituting the socket rows 75C to 75P are connected in a daisy chain shape by each of the second wiring systems 60c to 60p.

That is, one second wiring system 60a to 60p is provided for one socket row 75A to 75P, and consequently, the burn-in board 20 of one or more embodiments includes sixteen second wiring systems 60a to 60p for 320 sockets $70A_1$ to $70P_{20}$.

Each of the first wiring systems $50a_1$ to $50h_{10}$ is independently connected to the connector 80. Each of the first wiring systems $50a_1$ to $50h_{10}$ is connected to a separate driver of the burn-in controller 13 via the connector 80. As an example, as shown in FIG. 3, the first wiring system $50a_1$ is connected to the driver 14b, while the other first wiring system $50a_2$ is connected to a driver 14c different from the driver 14b.

Further, as shown in FIG. 4, the first wiring system $50a1$ is connected to the same contact pins 71a (e.g., contact pins 71a located at the third row and third column in the figure) among the contact pins 71 of the sockets $70A_1$, $70A_2$, $70B_1$ and $70B_2$. Similarly, the other first wiring systems $50a_2$ to $50h_{10}$ are also connected to the same contact pins 71a in the sockets 70.

The first signal transmitted between the burn-in controller 13 and the socket 70 via the first wiring systems $50a_1$ to $50h_{10}$ includes both an input signal input to the DUT 100 electrically connected to the socket 70 and an output signal output from the DUT 100. Specifically, such a first signal may exemplify a signal that includes a signal for writing data to the DUT 100 and includes a signal for reading data from the DUT 100. This first signal is a signal that requires a high-quality waveform, and the waveform quality of the signal is better as the number of sockets connected to one wiring system is smaller. Therefore, in one or more embodiments, each of the first wiring systems $50a_1$ to $50h_{10}$ is connected to only four sockets 70.

The number of the branch point of the first wiring system is not limited to one, and for example, the first wiring system may have a plurality of branch points. Since the wave quality is affected as the frequency of the signal is higher, the number of branch portions may be small.

Each of the second wiring systems 60a to 60p is independently connected to the connector 80. Each of the second wiring systems 60a to 60p is connected to a separate driver of the burn-in controller 13 via the connector 80. As an example, as shown in FIG. 3, the second wiring system 60a is connected to the driver 14a, while the other first wiring system 60b is connected to a driver 14d different from the driver 14a. The drivers 14a and 14d are different from the drivers 14b and 14c to which the above-mentioned first wiring systems $50a_1$ and $50a_2$ are connected.

Further, as shown in FIG. 4, the second wiring system 60a is connected to the same contact pins 71b (e.g., contact pins 71b located at the second row and second column in the figure) among the contact pins 71 of the sockets $70A_1$ to $70A_{20}$, and the contact pins 71b are different from the contact pins 71a to which the first wiring systems 50a are connected. Similarly, the other second wiring systems 60b to 60p are also connected to the same contact pins 71b in the sockets 70.

The second signal transmitted between the burn-in controller 13 and the socket 70 via the second wiring system 60a includes only an input signal input to the DUT 100 electrically connected to the socket 70. Specifically, such a second signal may exemplify, for example, an address signal, a clock signal, or the like. Since this second signal is not required to have a higher quality waveform in comparison with the first signal described above, in one or more embodiments, each of the second wiring systems 60a to 60p is connected to twenty sockets 70.

The number of sockets 70 connected by one second wiring system is not particularly limited to the above, it can be set according to the waveform quality or the like required. For example, five sockets 70 may be connected in a daisy chain shape by one second wiring system. Alternatively, ten sockets 70 may be connected in a daisy chain shape by one second wiring system.

Although not particularly shown, other wiring systems are also connected to the contact pins 71 other than the contact pins 71a and 71b of the socket 70. That is, the wiring systems are independently connected to all the contact pins 71 of the socket 70.

The other wiring system may have the same type of connection form as the first or second wiring system described above, or may have a different type of connection form from the first and second wiring forms. For example, the other wiring system may have a connection form that has a branch point at a position different from the first wiring form described above. The connection form of these other wiring systems can be set according to the waveform quality or the like required.

Here, regarding the input signal, when the burn-in controller 13 has a timing correction function, it is possible to input the signal to all the DUTs 100 at the same timing by calibrating the timing correction function. On the other hand, regarding the output signal, it is difficult to adjust the timing of the output signal from the DUT 100 even when the timing correction function is used. Therefore, a transmission delay time of the signal occurs depending on the length of the wiring between the connector and the socket. The problems due to such transmission delay time tends to become more remarkable as the frequency of the signal is higher.

Therefore, in one or more embodiments, the connection form of the first wiring systems $50a_1$ to $50h_{10}$ for transmitting the first signal including the output signal is the first connection form having the branch point 511 as described above. Thus, even when the number of sockets 70 on the burn-in board 20 is increased, it is possible to reduce the transmission delay time of the first signal.

For example, in comparison with the case where the four sockets $70A_1$ to $70A_4$ are connected in a daisy-chain shape in a row according to the increasing of the number of sockets 7, the socket $70A_3$ and $70A_4$ are replaced with the socket $70B_1$ and $70B_2$ close to the connector 80, and the four sockets $70A_1$, $70A_2$, $70B_1$ and $70B_2$ are connected by the first wiring system $50a_1$ described above, thereby it is possible to shorten the wiring length from the connector 80 to the socket $70B_1$ and $70B_2$.

On the other hand, since the second signal is not required to have a high quality waveform as compared with the first signal, the connection form of the second wiring systems 60a to 60p for transmitting the second signal is a second connection form that has no branch point as described above. Thus, it is possible to cope with the increasing of the number of sockets 70 while the number of drivers is limited by increasing the number of sockets 70 connected in a daisy chain shape.

Therefore, in one or more embodiments, even when the number of sockets 70 is increased, it is possible to suppress the deterioration of the quality of the burn-in test by making the type of the connection form of the wiring system different depending on the type of the signal.

It should be noted that the embodiments described above are described to facilitate understanding of the present disclosure and are not described to limit the present disclosure. It is therefore intended that the elements disclosed in the above embodiments include all design modifications and equivalents to fall within the technical scope of the present disclosure.

For example, the configuration of the burn-in apparatus 1 described above is only an example and is not particularly limited to the above. For example, the burn-in apparatus 1 described above performs temperature adjustment of the DUT 100 by using the constant Thermostatic room 111 but is not particularly limited thereto. For example, the burn-in apparatus 1 may be configured to perform temperature adjustment of the DUT 100 by bring a temperature adjustment pusher into contact with the DUT 100.

Although the disclosure has been described with respect to only a limited number of embodiments, those skilled in the art, having benefit of this disclosure, will appreciate that various other embodiments may be devised without departing from the scope of the present disclosure. Accordingly, the scope of the disclosure should be limited only by the attached claims.

REFERENCES SIGNS LIST

1 . . . Burn-in apparatus
11 . . . Burn-in chamber
111 . . . Thermostatic room
112 . . . Door
113 . . . Slot
114 . . . Rail
115 . . . Connector
116 . . . Evaporator
117 . . . Heater
118 . . . Fan
12 . . . Test power supply
13 . . . Burn-in controller
14a to 14d . . . Driver
20 . . . Burn-in board
30 . . . Wiring Board
40 . . . Board
41, 42 . . . End
$50a_1$ to $50h_{10}$ . . . First wiring system
51 . . . Main line
511 . . . Branch point
52, 53 . . . Sub line
54, 55 . . . Connection line 60a to 60p . . . Second wiring system
61a, 61b . . . Main line
$62a_1$ to $62a_{19}$, $62b_1$ to $62b_{19}$ . . . Connection line
70, $70A_1$ to $70P_{20}$ . . . Socket
71, 71a, 71b . . . Contact pin
75A to 75P . . . Socket row
80 . . . Connector
100 . . . DUT

What is claimed is:

1. A burn-in board comprising:
a board;
sockets mounted on the board;
a connector mounted on the board; and
wiring systems disposed in the board and connecting the sockets and the connector, wherein
the wiring systems comprise:
   a first wiring system that transmits a first signal; and
   a second wiring system that transmits a second signal different from the first signal, and
the first connection form has a portion in which a wiring branches between the connector and one of the sockets and is connected to another of the sockets,
the second connection form does not have a portion in which a wiring branches between the connector and the one of the sockets,
the sockets include first to third sockets,
the first wiring system comprises:
   a first main line connected to the connector;
   a first sub line connected to the first main line at a branch point and to the first socket; and
   a second sub line connected to the first main line at the branch point and to the third socket, and
the second wiring system comprises:
   a second main line connected to the connector and to the first socket; and
   a third connection line connecting the first socket and the second socket.

2. The burn-in board according to claim 1, wherein the first signal includes an output signal from a DUT (Device Under Test) that is electrically connected to the socket, and the second signal includes an input signal to the DUT.

3. A burn-in apparatus comprising the burn-in board according to claim 1.

4. A burn-in board comprising:
a board;
sockets mounted on the board;
a connector mounted on the board; and
wiring systems disposed in the board and connecting the sockets and the connector, wherein
the wiring systems comprise:
   a first wiring system that transmits a first signal; and
   a second wiring system that transmits a second signal different from the first signal, and
   a type of a first connection form of the first wiring system is different from a type of a second connection form of the second wiring system,
the sockets include first to fourth sockets, and
the first wiring system comprises:
   a first main line connected to the connector;
   a first sub line connected to the first main line at a branch point and to the first socket;
   a second sub line connected to the first main line at the branch point and to the third socket;
   a first connection line connecting the first socket and the second socket; and
   a second connection line connecting the third socket and the fourth socket.

5. The burn-in board according to claim 4, wherein the board comprises:
   a first end to which the connector is attached; and
   a second end opposite to the first end,
the first and second sockets are disposed along a first direction from the first end toward the second end,
the third and fourth sockets are disposed along the first direction,
the first and third sockets are disposed along a second direction orthogonal to the first direction, and
the second and fourth sockets are disposed along the second direction.

6. The burn-in board according to claim 4, wherein a wiring length between the branch point and the first socket is equal to a wiring length between the branch point and the third socket, and
a wiring length between the branch point and the second socket is equal to a wiring length between the branch point and the fourth socket.

7. The burn-in board according to claim 4, wherein the sockets include fifth to seventh sockets, and the second wiring system comprises:
   a second main line connected to the connector and to the fifth socket;
   a third connection line connecting the fifth socket and the sixth socket; and
   a fourth connection line connecting the sixth socket and the seventh socket.

8. The burn-in board according to claim 7, wherein the board comprises:
   a first end to which the connector is attached; and
   a second end opposite to the first end, and
the fifth to seventh sockets are disposed in order along a first direction from the first end toward the second end.

9. The burn-in board according to claim 7, wherein the first socket corresponds to the fifth socket, and the second socket corresponds to the sixth socket.

10. The burn-in board according to claim 4, wherein the first connection form has a portion in which a wiring branches between the connector and one of the sockets and is connected to another of the sockets, and
the second connection form does not have a portion in which a wiring branches between the connector and the one of the sockets.

11. The burn-in board according to claim 4, wherein the first signal includes an output signal from a DUT (Device Under Test) that is electrically connected to the socket, and
the second signal includes an input signal to the DUT.

12. A burn-in apparatus comprising the burn-in board according to claim 4.

\* \* \* \* \*